United States Patent
Dimou et al.

(10) Patent No.: US 8,495,543 B2
(45) Date of Patent: Jul. 23, 2013

(54) MULTI-LEVEL DOMINO, BUNDLED DATA, AND MIXED TEMPLATES

(75) Inventors: Georgios Dimou, San Diego, CA (US); Peter A. Beerel, Encino, CA (US); Andrew Lines, Malibu, CA (US)

(73) Assignees: University of Southern California, Los Angeles, CA (US); Fulcrum Microsystems, Inc., Calabasas, CA (US)

( * ) Notice: Subject to any disclaimer, the term of this patent is extended or adjusted under 35 U.S.C. 154(b) by 263 days.

(21) Appl. No.: 12/527,187

(22) PCT Filed: Jun. 17, 2009

(86) PCT No.: PCT/US2009/047702
§ 371 (c)(1), (2), (4) Date: Sep. 27, 2010

(87) PCT Pub. No.: WO2009/155370
PCT Pub. Date: Dec. 23, 2009

(65) Prior Publication Data
US 2011/0029941 A1      Feb. 3, 2011

Related U.S. Application Data

(60) Provisional application No. 61/073,621, filed on Jun. 18, 2008.

(51) Int. Cl.
*G06F 17/50* (2006.01)
(52) U.S. Cl.
USPC .......................................... 716/114; 716/115
(58) Field of Classification Search
USPC .................................. 716/110–116
See application file for complete search history.

(56) References Cited

U.S. PATENT DOCUMENTS

| 6,557,161 B2 * | 4/2003 | Jones ............................ 716/117 |
| 2003/0159078 A1 | 8/2003 | Davies et al. |
| 2003/0233622 A1 * | 12/2003 | Nystrom et al. .................. 716/1 |
| 2004/0030858 A1 * | 2/2004 | Lines et al. ..................... 712/11 |
| 2005/0007151 A1 | 1/2005 | Nystrom et al. |
| 2005/0156633 A1 | 7/2005 | Singh et al. |
| 2006/0212628 A1 | 9/2006 | Lines et al. |

OTHER PUBLICATIONS

Chu, T. A. 1987. Synthesis of Self-timed VLSI Circuits from Graph-theoretic Specifications. Doctoral Thesis, Massachusetts Institute of Technology, Jun. 1987.

(Continued)

*Primary Examiner* — Binh Tat
(74) *Attorney, Agent, or Firm* — McDermott Will & Emery LLP

(57) ABSTRACT

Techniques are described for generating asynchronous circuits (e.g., in the form of one or more netlists) for implementation, e.g., in integrated circuitry/chips. Embodiments are directed to asynchronous multi-level domino design template and several variants including a mixture of domino and single-rail data logic. The templates can provide high throughput, low latency, and area efficiency. A multi-level domino template is partitioned into pipeline stages in which each stage consists of potentially multiple-levels of domino logic controlled by a single controller that communicates with other controllers via handshaking. Each stage is composed of two parts: a data path and a control path. The data path implements the computational logic, both combinational and sequential using efficient dual-rail domino logic. The control path implements a unique four-phase handshake to ensure correctness and the preservation of logical dependencies between pipeline stages. The data path and controller interact through a small number of key control signals.

36 Claims, 7 Drawing Sheets

OTHER PUBLICATIONS

Fant, K.M.; Brandt, S.A. 1996. NULL Convention LogicTM: A Complete and Consistent Logic for Asynchronous Digital Circuit Synthesis. Proceedings of International Conference on Application Specific Systems, Architectures and Processors, pp. 261-273, Aug. 1996.

Ferretti, M. 2004. Single-track Asynchronous Pipeline Templates Using 1-of-N Encoding. University of Southern California, Technical Report. Aug. 2004, 8 pages.

Harris, D.; Horowitz, M. A. 1997. Skew-Tolerant Domino Circuits. IEEE Journal of Solid-State Circuits, 32(11), pp. 1702-1711, Nov. 1997.

Lines, A. 1995. Pipelined Asynchronous Circuits. Masters Thesis, California Institute of Technology, Jun. 1995.

Murata, T. 1989. Petri Nets: Properties, Analysis and Applications. Proceedings of the IEEE vol. 77, Issue 4, pp. 541-580, Apr. 1989.

Ozdag, R.O.; Beerel, P.A. 2002. High-Speed QDI Asynchronous Pipelines. Proceedings of the Eighth International Symposium on Asynchronous Circuits and Systems (ASYNC '02), 10 pages.

Ozdag, R. 2003. Template Based Asynchronous Design. Doctoral Thesis, the University of Southern California Nov. 2003. 130 pages.

Singh, M.; Nowick, S. M. 2000. Fine-Grain Pipelined Asynchronous Adders for High-Speed DSP Applications. Proceedings of the IEEE Computer Society Annual Workshop on VLSI, p. 111, 2000.

Singh, M.; Nowick, S. M. 2007. The Design of High-Performance Dynamic Asynchronous Pipelines: High-Capacity Style. IEEE Transactions on Very Large Scale Integration (VLSI) Systems. vol. 15, Issue 11, Nov. 2007 pp. 1270-1283.

Smirnov, A.; Taubin, A.; Su, M.; Karpovsky, M. 2005. An Automated Fine-Grain Pipelining Using Domino Style Asynchronous Library. Fifth International Conference on Application of Concurrency to System Design, pp. 68-76, Jun. 2005.

Williams, T. E. 1991. Self-timed rings and their application to division, Ph.D. dissertation, Stanford University, Stanford, CA. 161 pages.

Williams, T. E. and M. A. Horowitz. 1991. A zero-overhead self-timed 160ns 54b CMOS divider, IEEE J. Solid-State Circuits, vol. 26, No. 11, pp. 1651-1661, Nov. 1991.

International Search Report and Written Opinion of the International Searching Authority, mailed Jul. 29, 2009, for PCT Application No. PCT/US09/47702.

\* cited by examiner (A)                                   (B)

[~_RESET]; L.e+, en-, eval-, _pc-; V-; [_RESET]; (en+, _pc+); eval+;
*([[V & L.0]; L.e-; en-; eval-; ([~L.0]; L.e+; en+),  ([~R.e]; _pc-;
[~V]; _pc+); [R.e]; eval+]) ||
*( [L.e]; L.0+; [~L.e]; L.0- ) ||
*( [V]; R.e-; [~V]; R.e+ ) ||
*( [en & eval]; V+; [~_pc]; V-)

(a)    (b)

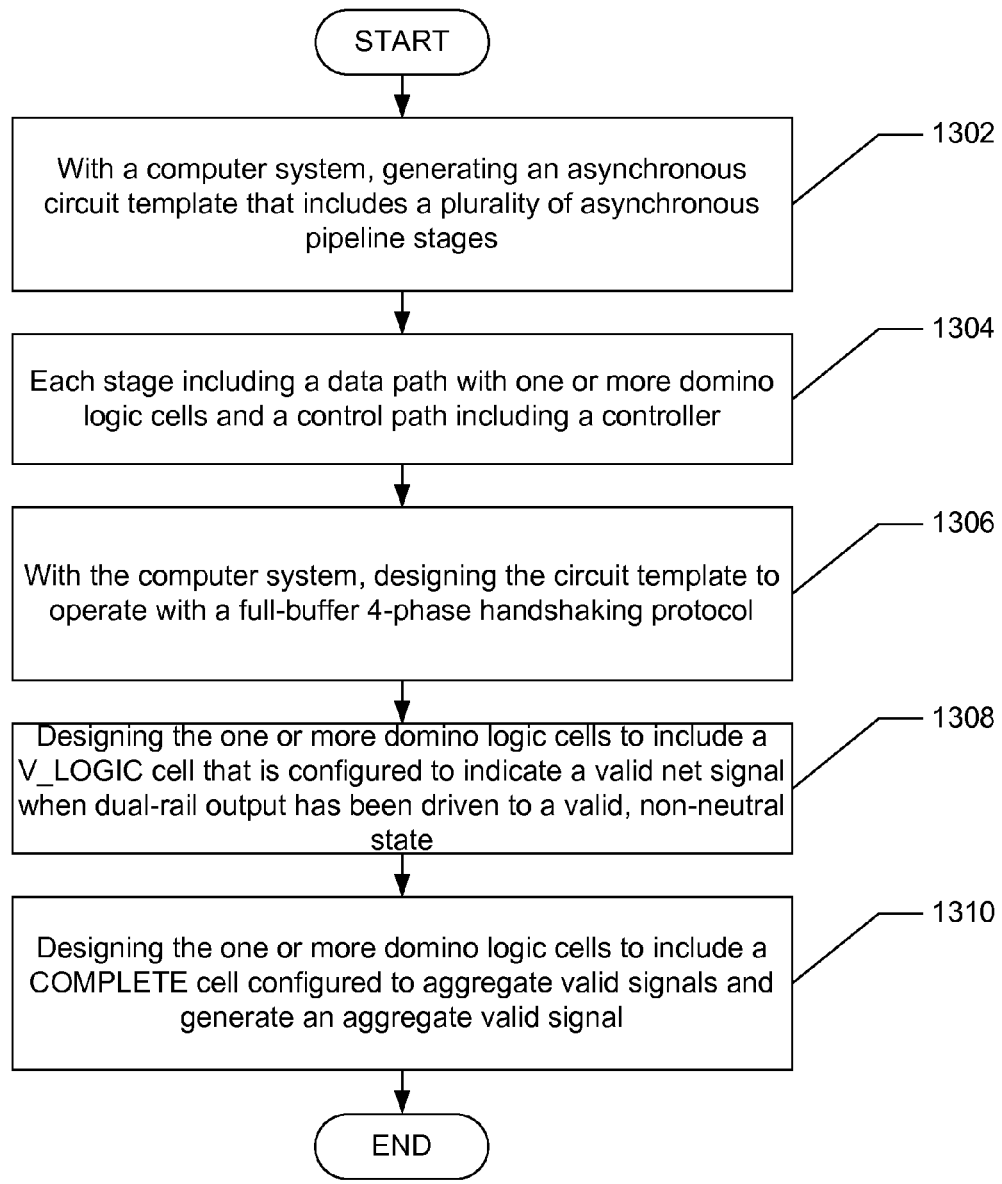

MULTI-LEVEL DOMINO, BUNDLED DATA, AND MIXED TEMPLATES

RELATED APPLICATION

This application is a U.S. National Phase filing of PCT Application Serial No. PCT/US2009/047702, entitled "Multi-Level Domino, Bundled Data, and Mixed Templates," filed 17 Jun. 2009, which claims the benefit of U.S. Provisional Patent Application No. 61/073,621, filed 18 Jun. 2008 and entitled "Multi-Level Domino, Bundled Data, and Mixed Templates." The entire contents of both applications are incorporated herein by reference.

BACKGROUND

For synchronous electronic circuits relying on clocks and timing circuitry, all data is synchronized by a global circuit clock. In between combinational logic blocks, latches (e.g., flip-flops) are inserted, which function to latch the data once per period of the clock hence achieving the synchronization of data and control signals among the different circuit elements.

Asynchronous circuits are fundamentally different in that, while using binary signals, there is no common and discrete time between all the various circuit components. In asynchronous circuits, synchronization is achieved through handshaking protocols that are implemented to assist the various circuit elements with the exchange of data. There are many styles of asynchronous design libraries and flows, and almost each one has a different handshaking mechanism associated with it.

For the handshaking protocols implemented for asynchronous circuits, the handshaking between two asynchronous units exchanging data (e.g., a "latch") often starts with the unit where the data is originating from sending a request to the receiver. Typically the request is sent when the data is ready and depending on the protocol this could be part of the data or a separate control signal. The receiver has to then acknowledge the receipt of the data. Then the transmitting module knows that the data has been consumed and can reset its value, in order to be ready to process the next set of data. This Request-Acknowledgement exchange can be performed in several different ways and handshaking protocols can be classified according to the nature of this exchange.

There are two distinct kinds of protocols commonly used for asynchronous circuits, the 2-phase and the 4-phase protocol. In the 4-phase protocol case the sender asserts its request (REQ) to inform the receiving element that it holds valid data on its output. The receiving element will then receive the data when it is ready to consume it and raise the acknowledgment (ACK) signal when it has actually done so. The sender will then reset its REQ signal and after that the receiver will lower its ACK signal. The second pair of transitions could also be used to explicitly identify a data reset phase. The 2-phase protocol only uses two active transitions to complete the communication handshake. Therefore, all transitions of the REQ/ACK signals are used in the same way, whether falling or rising. That means that during the first cycle the sender raises REQ and then the receiver raises ACK to finish the handshake. Instead of resetting the signals before the second communication, the protocol is implemented so that the sender lowers REQ to start the next transfer, and then the receiver lowers ACK to acknowledge the data. The request and acknowledgment signals could be individual signals or they could be implemented across the same wire. The later is also known as single-track communication.

The basic forms described above are for point-to-point communications between two adjacent units and the communication cycle is always initiated by the sender. When the sender initiates the protocol it is considered a push channel, and they are common in pipelined circuits. In other non-pipelined circuits, however, the receiver signals that it is ready first before the sender produces any data. This is known as a pull channel and the initial request is sent by the receiver and in the reverse direction of the data flow. For example an adaptation of the 4-phase protocol described previously for push channels can be used for pull channel communications. The receiver asserts the REQ signal to indicate that it is ready to accept data. When the sender has computed the data and put it on the channel it asserts its ACK signal. The receiver then lowers its REQ signal as soon as it has consumed the data. Finally the sender lowers its ACK signal after it has reset the data and the channel is now ready for the next transmission.

All the examples stated up to this point are examples of point-to-point communications. This means that the sender sends a signal to indicate the presence of data and releases the data when that gets acknowledged. Another quite interesting case is called enclosed communication. It is defined as the case where the REQ signal is asserted and then followed by an entire handshake from the receiver side (meaning the ACK is both asserted and de-asserted), before the REQ signal gets de-asserted. This type of behavior might not make a difference in a typical push pipelined channel, however its usefulness becomes apparent when considering cases where performing sequential actions is desired instead of concurrent actions. Assume that the sender wants to generate data and then there are multiple receivers that are going to operate sequential actions based on this data. The REQ signal can then be asserted to validate the data on the sender side. Then multiple receivers can take turns operating on the data and the REQ signals stays high validating its presence. When the last one of the receivers is done processing the sender can lower the REQ signal and reset the data. Additionally it can also be the case that some or all of these processes operate on the data with some level of concurrency as well.

Data encoding can be another way of classifying asynchronous channels based on the way that the data is encoded on the channel. The way that is closest to typical synchronous designs is called bundled data. In bundled data the data is presented in the form of a bus of single rail wires from the sender to the receiver. This has the benefit that only one wire per signal is only required and that the signals could be generated by single-rail combinational blocks just like those used for synchronous design. However there is no way to identify that the data is valid on the receiver end by just observing the data rails, hence the designer has to make sure that the data is all valid before the REQ signal becomes visible to the receiver. For this reason the REQ path has to be delay matched with the slowest combinational path between sender and receiver and this task is not trivial. Post layout simulation is typically required to ensure the functionality of the circuit.

Another way to encode data on a channel is by making it dual-rail. If the dual-rail signals are reset between transitions it is now easy to verify the presence of the data by the data itself by making sure that at least one of the two wires representing the data has been asserted. In this case an explicit REQ line is not necessary for the data, as a simple OR of the two signals verifies that the data is present. Dual-rail signals can also be grouped together in busses as in bundled data. If there is no explicit REQ like in the bundled-data rails all the individual OR results from each signal has to be combined to generate the global REQ signal for the bus. When one bit is transferred a single gate delay is added to the critical path, but in the later case the impact of such a circuit to the performance of the circuit could be significant since it could amount to several gate delays.

Due to the fact that asynchronous circuits require a handshaking controller for every pipeline stage, which is used to interface to adjacent pipeline stages, the logic overhead of such circuits is large. Moreover, there is a lack of an automated set of tools that would allow a designer to generate a circuit quickly from a behavioral Hardware Description Language (HDL), just like the ASIC flow that has existed for years for synchronous circuits.

SUMMARY

Aspects of the present disclosure are directed to techniques, including system, software, methods, and algorithms for asynchronous circuit design. Aspects and embodiments of the present disclosure can be used to generate asynchronous circuits (e.g., in the form of one or more netlists) for implementation, e.g., in integrated circuitry/chips. Embodiments of the present disclosure are directed to asynchronous design templates for a circuit called multi-level domino and several variants include a mixture of domino and single-rail data logic. The templates can provide high throughput, low latency, and area efficiency.

In the basic multi-level domino template, the circuit is partitioned into pipeline stages. Each stage consists of potentially multiple-levels of domino logic controlled by a single controller that communicates with other controllers via handshaking. Each stage is composed of two parts: a data path and a control path. The data path implements the computational logic, both combinational and sequential using efficient dual-rail domino logic. The control path implements a unique four-phase handshake to ensure correctness and the preservation of logical dependencies between pipeline stages. The data path and controller interact through a small number of key control signals. Templates can be designed with suitable computer systems (e.g., stand alone or having functionality distributed over a network) including processing and I/O functionality. I/O functionality of such systems can include any suitable type, including, but not limited to, mouse, keyboard, touch screen, track ball, file transfer, and the like.

It should be understood that while certain embodiments/aspects are described herein, other embodiments/aspects according to the present disclosure will become readily apparent to those skilled in the art from the following detailed description, wherein exemplary embodiments are shown and described by way of illustration. The techniques and algorithms are capable of other and different embodiments, and details of such are capable of modification in various other respects. Accordingly, the drawings and detailed description are to be regarded as illustrative in nature and not as restrictive.

BRIEF DESCRIPTION OF THE DRAWINGS

It should be understood that while certain embodiments/aspects are described herein, other embodiments/aspects according to the present disclosure will become readily apparent to those skilled in the art from the following detailed description, wherein exemplary embodiments are shown and described by way of illustration. In the drawings:

FIG. 13 depicts a method of designing asynchronous circuit templates, in accordance with exemplary embodiments of the present disclosure.

Figure 1:
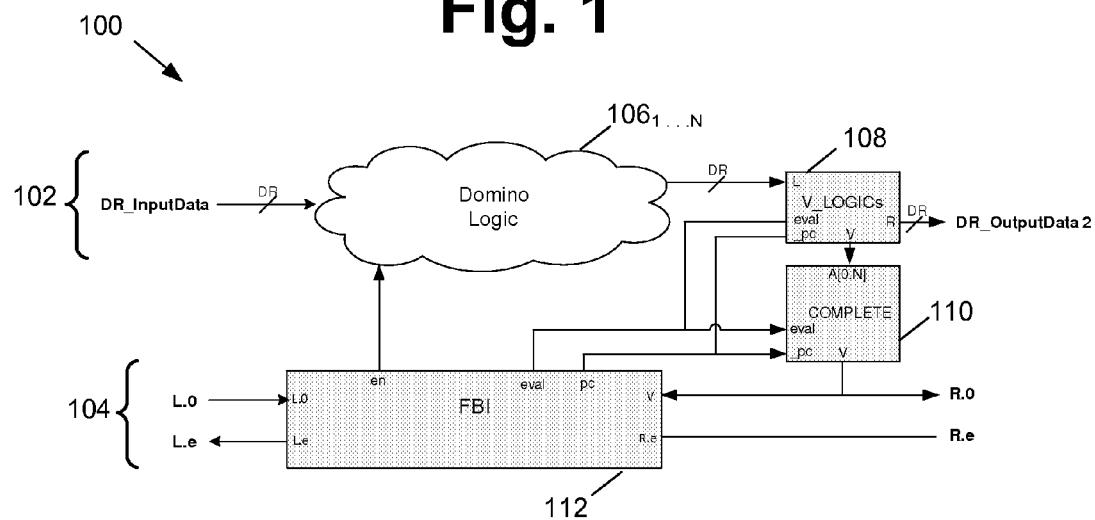
FIG. 1 depicts an schematic view of a basic MLD template, in accordance with exemplary embodiments of the present disclosure.

The techniques and algorithms of the present disclosure are capable of other and different embodiments, and details of such are capable of modification in various other respects. Accordingly, the drawings and detailed description are to be regarded as illustrative in nature and not as restrictive. While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Aspects and embodiments of the present disclosure are directed to techniques that can enable an ASIC design flow for the asynchronous circuit designs. Techniques are described for generating such circuits, from any arbitrary HDL representation of a circuit by automatically clustering the synthesized gates into pipeline stages, which can then be slack-matched to meet performance goals while minimizing area.

Embodiments of the present disclosure are directed to asynchronous design template called multi-level domino ("MLD") and several variants that include a mixture of domino and single-rail data logic. These templates can provide high throughput, low latency, and area efficiency for asynchronous circuits.

FIG. 1 depicts a schematic view of a basic MLD template 100, in accordance with exemplary embodiments of the present disclosure. In a basic multi-level domino template 100, the circuit is partitioned into pipeline stages, where each stage includes a data path 102 and a control path 104. Each stage consists of potentially multiple-levels of domino logic $106_{1...N}$ controlled by a single controller that communicates with other controllers via handshaking.

As stated, each stage can be composed of two parts: a data path 102 and a control path 104. The data path 102 implements the computational logic, both combinational and sequential using efficient dual-rail domino logic (where dual rail is indicated by "DR"). The control path 104 includes a controller 112 and implements a unique 4-phase handshake to ensure correctness and the preservation of logical dependencies between pipeline stages. The datapath 102 and controller 112 interact through a small number of key control signals, as described in detail below. The data path 102 of each stage can include a cell for driving bits to fan out to other MLD stages, e.g., a V_LOGIC cell as shown in FIG. 1. Each MLD stage can have many output bits; accordingly, a logical AND of all the output bits can be performed on the valid signals. Accordingly, an aggregate valid signal can be generated, e.g., as by a COMPLETE cell 110 as shown in FIG. 1.

Data Path: The data path logic inside an MLD stage 100 may have only a few hard requirements to conform to MLD template rules, in accordance with the present disclosure. Logic in a given stage may have a fairly arbitrary structure without regard to logic function. It is preferable that all bits be composed of 2 dual-rail wires, and that all logic cells be implemented as domino or static logic. However, extensions to other logic encoding, including more general 1-of-N logic is straight-forward. Each logic cell can be enumerated in a special domino cell library, which can be selected as a technology library of any commercial logic synthesis tool.

Figure 2:
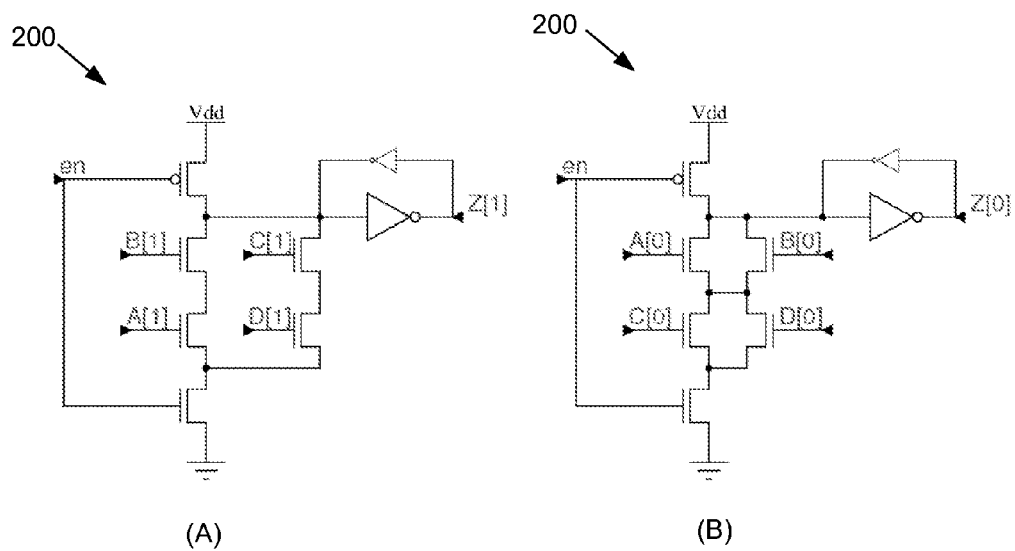
FIG. 2 depicts a diagram of a domino logic cell, in accordance with exemplary embodiments of the present disclosure.

Dual-Rail Domino Cells: Each domino logic cell primitive can have a similar structure. FIG. 2 depicts a diagram of a domino logic cell 200 for two different states (A) and (B), in accordance with exemplary embodiments of the present disclosure. Since these cells (e.g., cell 200) are dual-rail ("DR"), two circuit structures exist inside each cell, one for the true rail and another for the false rail. Inputs to each leaf cell gate only NMOS transistors. There is one network of NMOS transistors in series with only one PMOS transistor. The PMOS transistor, as in all implementations of domino logic, is driven by a special pre-charge signal, driven in this case by the MLD control logic. The node where the PMOS and NMOS stacks intersect is the internal node, which is pulled high during pre-charge, and pulled low during evaluation. This internal node then drives an inverter, which allows the output to drive other cells. Along with the inverter, there is another small staticizer inverter, used to keep the internal node stable when pulled high or low. This inverter prevents electrical noise from erroneously switching the internal node state.

Figure 3:
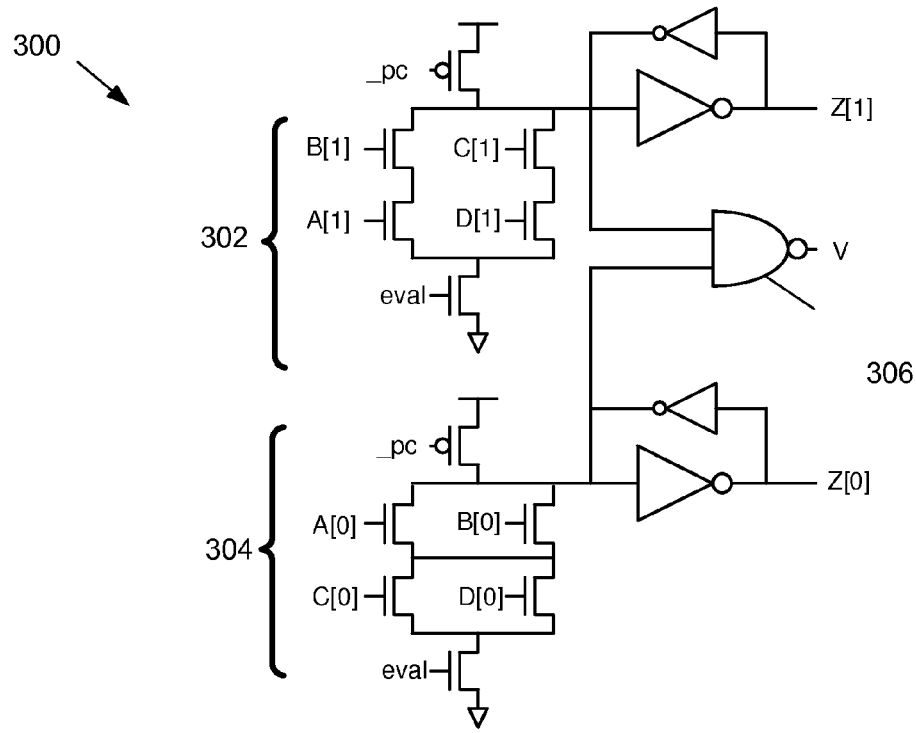
FIG. 3 depicts a diagram of a V_LOGIC cell, in accordance with exemplary embodiments of the present disclosure.

V_LOGIC and Complete Domino Cells: Cells which drive bits which fan out to other MLD stages must be special cells, known as V_LOGIC. FIG. 3 depicts a diagram of a V_LOGIC logic cell 300, in accordance with exemplary embodiments of the present disclosure.

V_LOGIC cells 300 are nearly the same as regular domino cells, e.g., cell 200 as shown in FIG. 2. Cell 300 includes two subsidiary cells 302 and 304 joined by a NAND gate 306. In addition to some other control signal inputs, an additional output signal is generated, e.g. the "V" or valid net signal at gate 306. This signal is the valid net, which indicates when dual-rail output has been driven to a valid, non-neutral value. It is logically equivalent to an OR of each dual-rail output signal. In addition to various domino logic cells, there are equivalent V_LOGIC versions of each cell in the MLD technology library. These V_LOGIC cells are not needed during logic synthesis, because they are determined only after each MLD stage is clustered. The final drive cell can be converted to its V_LOGIC counterpart after each stage has been defined. It will be common for an MLD stage to have many output bits, and thus an aggregate valid signal is generated for all outputs. This signal is a logical AND of all V_LOGIC valid signals. There is a special cell designed to perform this function, called a COMPLETE cell, e.g., as shown as described for FIG. 4.

An important distinction to make is the extra control signals on the V_LOGIC cells. Unlike the regular domino cells, V_LOGIC's pre-charge and evaluate transistors are driven independently. By using separate eval and _pc signals, it is possible for the control circuit to hold the logic in an "isolate" state where it retains a valid output value while ignoring any changes on the inputs.

Figure 4:
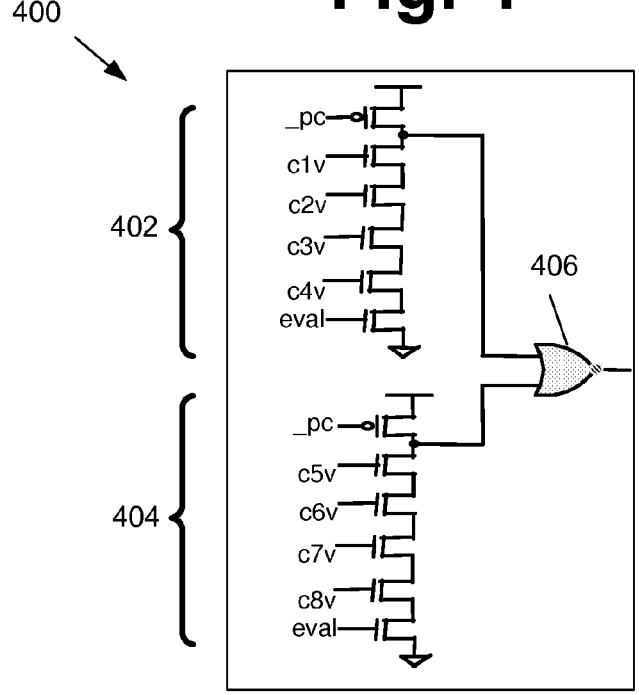
FIG. 4 depicts a diagram of an 8-input Complete cells, in accordance with exemplary embodiments of the present disclosure.

The domino gates are controlled by the same PC/Eval structure as the V_LOGIC cells, as illustrated in FIG. 4. A COMPLETE cell 400 includes subsidiary cells 402 and 404 joined by a NOR gate 406. COMPLETE cell 400 determines when all outputs are valid and is needed for stages with multiple dual-rail outputs. It combines all valid signals by logically ANDing all input "V" signals. It implements this AND with a tree of single-rail domino AND gates. Using a tree of these cells, a 64-bit wide complete cell be thus implemented with a latency of 4 gate delays and with a pre-charge delay of 2 gate delays.

TOK_BUF Stages: Some pipeline stages must inject an initial token after reset. They are also referred to herein as sequential pipeline stages. This mimics the logical behavior of a synchronous flip-flop. For pipelines stages which fit this criterion, the data path will have special cells which are substituted for V_LOGIC cells. All cells which drive stage outputs will be TOK_BUF or TOK_EDFF leaf cells. These cells are behaviorally simple, and implement nothing more than a logic buffer cell. They exist to preserve a one to one correspondence with cells in a synchronous netlist. They also have the functionality that a V_LOGIC cell has; they have the valid signal, _pc, eval, and reset. TOK_EDFF cells are similar to TOK_BUFs, but have an additional input mimicking the Enable pin of a flip-flop. When this pin is logic high, the TOK_EDFF updates state. When logic low, the cell will drive the previous data. There is no restriction on the amount or type of domino logic preceding the TOK_BUF or TOK_EDFF cells in a TOK_BUF stage.

Restriction: For exemplary embodiments, the following restrictions can be implemented in order to simplify the control aspects of a template; stages that initialize with tokens can have all TOK_BUF or TOK_EDFF be the final driving cell of all outputs; and, no MLD stage may have combinational outputs mixed with flip-flop outputs.

Control Path: The controller of each MLD stage is the most complex component. Accompanying the logic cells for each stage is one control path control circuit. This circuit will perform a 4-phase handshake with all fanin and fanout MLD stages, and drive the pre-charge and evaluate signals which govern the data path logic. By design, it will correctly ensure all data dependencies are respected, under all conditions. There are two versions of this controller, one for combinational stages, and another for sequential stages. Both are described in detail below.

Full-Buffer Isolate Controller: The control circuit is called the FBI controller, because it has some similar features with the Full-Buffer Isolate (FBI) control scheme proposed by Singh and Nowick.

TABLE 1

| MLD Signal | Meaning |
| --- | --- |
| L.0 | Left request |
| L.e | Left acknowledge |
| In[1:0] | Left data input rails |
| en | Enable |
| _pc | Precharge |
| eval | Evaluate |
| V | Valid |
| R.0 | Right request |
| R.e | Right acknowledge |
| Out[1:0] | Right data output rails |

Figure 5:
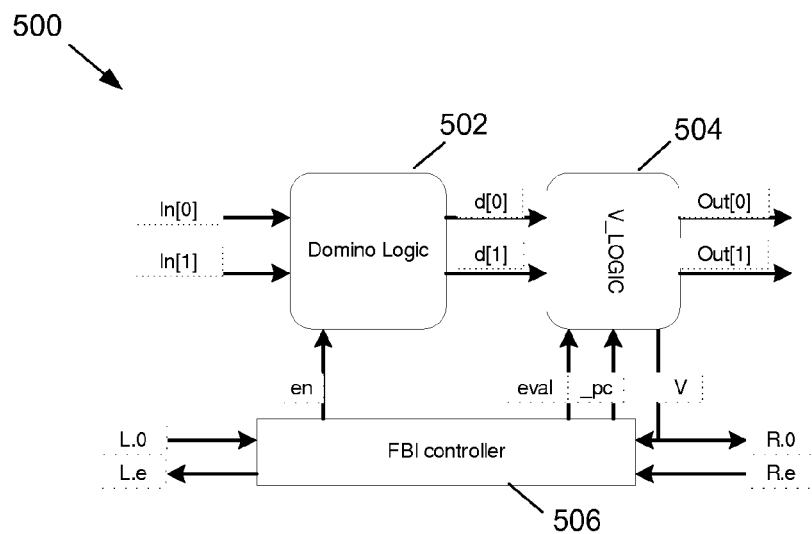
FIG. 5 depicts a diagram of a MLD stage with FBI controller, in accordance with exemplary embodiments of the present disclosure.

The controller implements an asynchronous full buffer pipeline cell, where a token may be present on both the input channel(s) and the output channel(s) concurrently. The FBI controller maintains correct sequencing to ensure this data flow case behaves correctly, and does not deadlock nor lose safeness. FIG. 5 depicts a diagram of an exemplary embodiment of a FBI block 500. FBI block 500 includes domino logic 502 and a V_LOGIC cell 504, as controlled by FBI controller 506.

A table showing the relevant control signals and their meaning is shown in TABLE 1. There is a request/acknowledge signal pair on the left side to handshake with fanin stages. Likewise, there is another request/acknowledge signal pair on the right side to handshake with fanout stages. At various times during handshaking, the FBI controller 506 will drive the pre-charge and enable lines to the data path to sequence computation. Control over the data path evaluation can be thought of in two parts. The first part, the domino logic 502, is controlled with the en signal. A single en signal is used to both pre-charge and evaluate this logic. When this signal is low, the domino logic is in pre-charge mode. When high, the domino logic 502 is in evaluate mode. The second part contains the V_LOGIC 504, which are the set of cells which drive outputs from the stage. V_LOGIC 504 uses a separate inverted pre-charge signal, _pc. When _pc is low and eval is low, the V_LOGIC 504 pre-charges. When _pc is high and eval is high, V_LOGIC 504 evaluates. _pc should never be low when eval is high, or else the PMOS and NMOS transistors will both be conducting at the same time, resulting in a short from Vdd to Gnd. When _pc is high and eval is low, the V_LOGIC 504 is in the "isolate" state where it holds its outputs valid but ignores any changes on the inputs.

The behavior of this system is best described using two representations: a Handshake Expansion ("HSE") description, and a Signal Transition Graph ("STG") description. HSE is described herein with regard to FIG. 6. A STG is simply a Petri Net which describes signal transitions. Both are sufficient to completely describe, and implement, this controller 506. Both are described herein for clarity.

Note also that at the circuit level, implementations based on dynamic or pseudo-static logic using C-elements and generalized C-element is possible. Alternatively, static logic implementations based on the sum-of-product implementations of C-elements and generalized C-elements with feedback are also possible.

Figure 6:
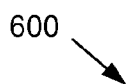
FIG. 6 depicts a listing of the handshaking expansion for an FBI controller description, in accordance with exemplary embodiments of the present disclosure.

Shown in FIG. 6 is the HSE description of the controller, along with the HSE describing the behavior of the environment. It is important to note that V and R.0 are the same signal in the control circuit. This HSE system can be understood in 5 separate parts:

(a) First 2 lines: Defines the reset behavior of the FBI block.
(b) First parenthesis: Defines the behavior of the FBI control block to environmental signals. In this block, R.0 does not appear. V is considered equivalent to R.0.
(c) Second parenthesis: Defines the 4-phase handshake on the Left Channel
(d) Third parenthesis: Defines the 4-phase handshake on the Right Channel
(e) Last parenthesis: Defines the behavior of the V input. The transitions of the V signal depend on both the _pc and eval signals.

Figure 7:
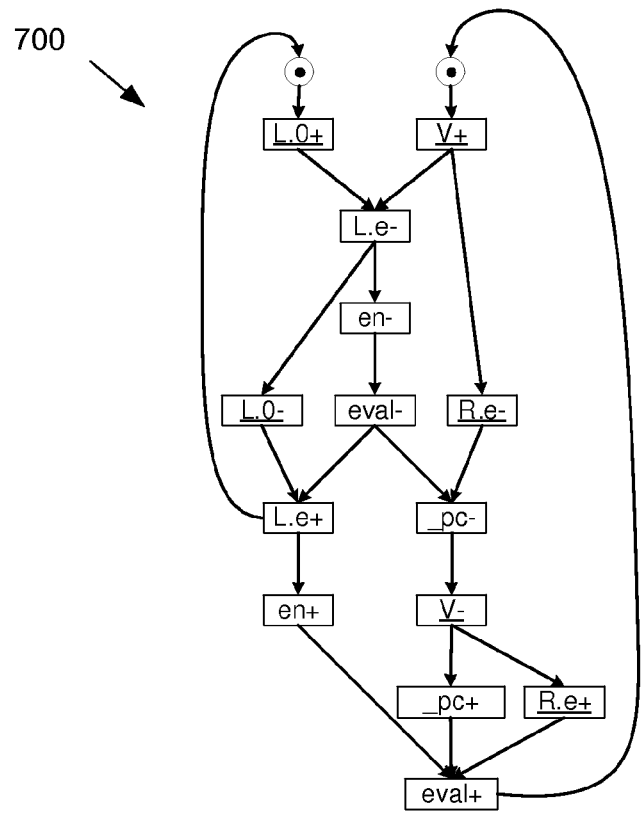
FIG. 7 depicts a Signal Transition Graph ("STG") for the FBI controller of FIG. 5.

FBI Controller Signal Transition Graph: A visual representation of a FBI controller is shown in FIG. 7 as Signal Transition Graph (STG) 700, which describes the FBI controller. The basic STG 700 represents a non-sequential controller. The initial marking of this STG corresponds to the point after which the reset sequence has completed, and no tokens present on both the right and left channels. This may be considered an "idle" state. The STG specification for the FBI controller of sequential stages is identical except it has a different initial marking indicating the presence of a token on the output (right) channel.

When an MLD stage has completed its pre-charge and is waiting for a new data token to arrive, both the domino logic and the V_LOGIC are in the evaluate state. This allows data to propagate immediately from an input through the data path, and arrive at any fanouts. The domino and V_LOGIC are then pre-charged when the handshaking allows it. The domino logic will pre-charge when data on the left side is acknowledged, and the V_LOGIC will pre-charge as soon as the current stage is acknowledged by all fanouts.

It is instructive to notice that R.0+ may occur before L.0+. This is a desirable property, and implements the notion of early evaluation. The FBI controller can ensure that the fanin and fanout handshakes proceed correctly, and causality and safeness are preserved. This feature decreases the global cycle time of the circuit, and reduces the burden of the FBI control on local cycle time.

Figure 8:
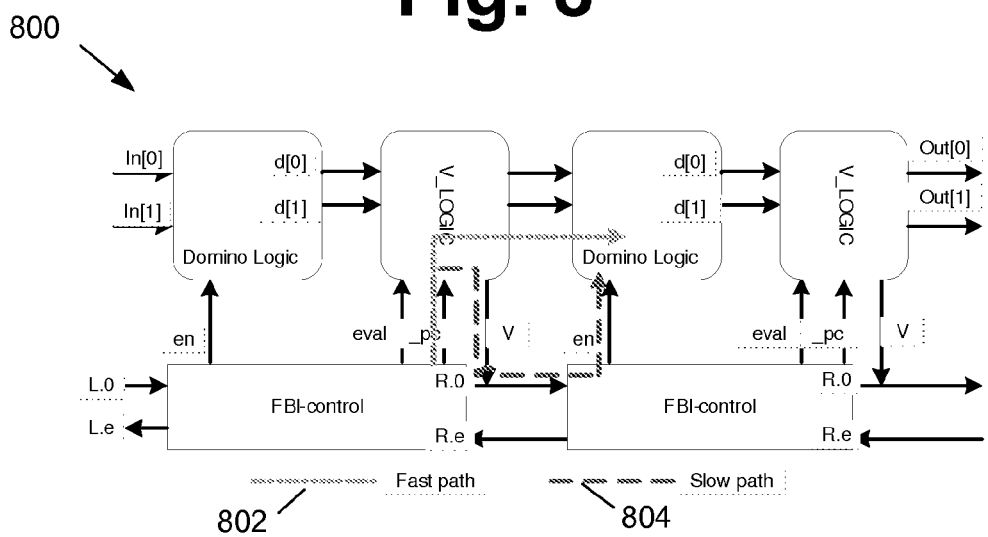
FIG. 8 depicts a timing constraint diagram for a MLD template, in accordance with exemplary embodiments of the present disclosure.

Timing and Throughput: An important attribute of any asynchronous template is the timing model under which it operates. The MLD templates, in accordance with the present disclosure, are nearly QDI, with one possible exception. They can have one additional timing assumption, which is referred to as implied neutrality. FIG. 8 depicts diagram 800 showing this timing constraint. In FIG. 8, two timing paths 802 and 804 are shown for two linked cells. One of the paths must be faster than the other path at all times. This case will occur when pre-charge transitions low (_pc−). The transition to neutrality on all outputs (low) must propagate to all fanouts before the R.0+ transition causes en+ to occur in the fanout stages. In effect, this means that fanout stages must not capture previous data on the data rails before they have been reset to neutral. This requirement describes a one-sided timing assumption, which should in practice be easy to meet. There is at least 4 transitions from when the data rails go neutral at the source stage to when the fanout stages will assert en+. This means that the wire delay on all data rails must not exceed 4 transitions.

The local cycle time of an MLD stage is 18 transitions for a logic depth (and width) of one. The forward latency is determined solely by the depth of the data path logic. Each domino cell has a latency of 2 transitions, so the FL becomes two times the logic depth. The backward latency of a stage is 16 transitions. The presence of join C-elements and acknowledge C-elements will increase the BL of a stage, by 2 transitions each.

Forks and Joins: Supporting forks are very straightforward for MLD. A fork occurs when the data rails of one stage terminate in at least two separate fanout stages. When this case occurs, the acknowledgement signal feeding the driving stage's R.e port must reflect the acknowledgement status of all fanouts. Aggregating the acknowledgements using a C-element achieves this. Similarly, joins are handled by aggregating all request signals into one via a C-element. The template is not intended to support conditional behavior.

For some applications, it is also possible to imbed some fork/join behavior directly into the FBI controller improving performance for non-linear pipelines with fork/joins. In some cases, this requires bubble shuffling to change the phase of the acknowledgement signals.

Figure 9:
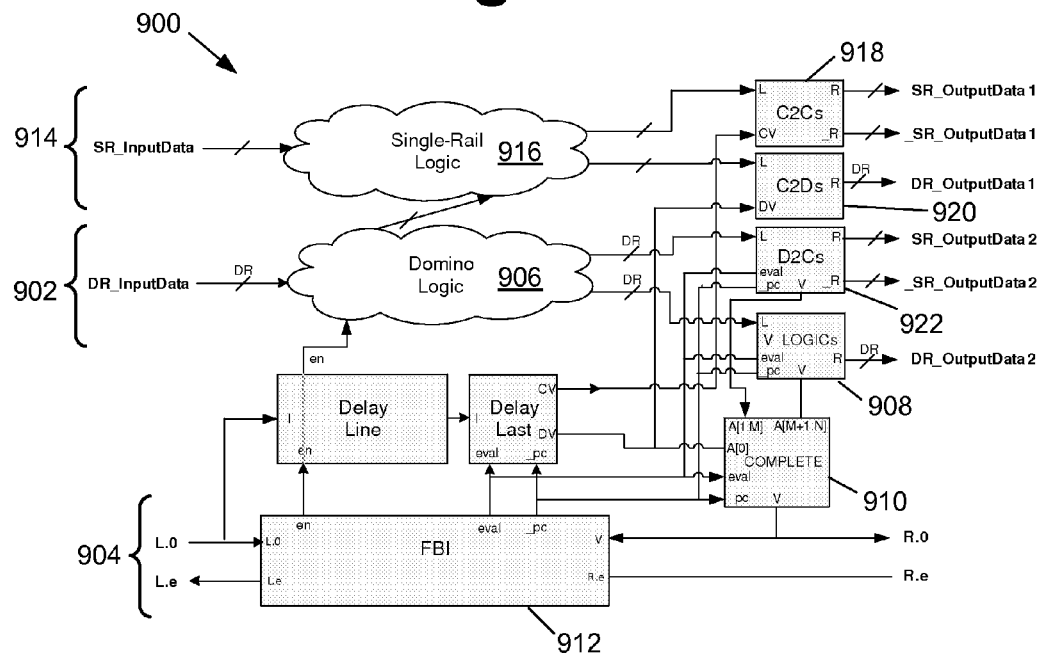
FIG. 9 depicts a diagram of a Mixed MLD and Bundled Data ("BD") Template with FBI controller, in accordance with exemplary embodiments of the present disclosure.

Mixing MLD and Bundled Data: For some applications, it may be desirable to have a design with mixed domino and bundled-data designs that use single-rail logic. It can be advantageous for a single stage to support a mixture of domino and single-rail logic. FIG. 9 depicts a diagram of an exemplary embodiment of such a mixed design template 900.

Template 900 includes similar structure as shown for FIG. 1, including a dual-rail data path 902, a control path 904, domino logic 906, V_LOGIC cell 908, COMPLETE logic cell 910, and a FBI controller 912. Mixed template 900 also includes a singe rail data path 914 with single-rail logic cell(s) 916 as well as additional output cells (C2Cs 918, C2Ds 920, and D2Cs 922).

In 900, the FBI controller supports this mixture with the mixed design template described in FIG. 9. The single-rail logic is latched with C2Cs 918 and C2D 920 elements that have single-rail and dual-rail outputs, respectively. The C2C can be implemented with well-known latch structures based on pass-gates or cross-coupled NAND/NOR structures in which CV qualifies L ands its inverse.

Figure 10:
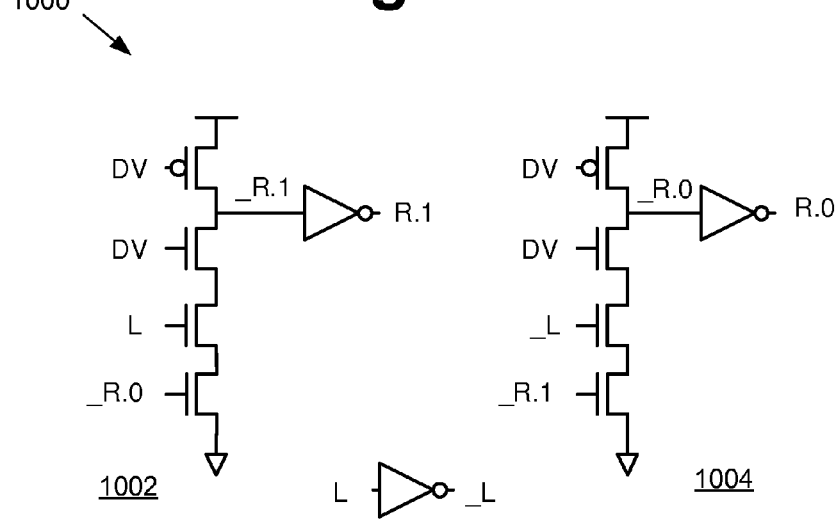
FIG. 10 depicts a diagram of a Dynamic-gate implementation of a C2D unit, in accordance with exemplary embodiments of the present disclosure.

The C2D 920 units can be implemented with dynamic cross-coupled structures that pre-charge when DV goes low, as illustrated in FIG. 10 or static logic equivalents.

FIG. 10 depicts a diagram of two dynamic cross-coupled structures 1002 and 1004 that pre-charge when DV goes low. The dual-rail outputs are converted to latched and converted to single-rail outputs in the D2C units. They can also feed the single-rail logic directly. The single-rail data output can be implemented using well-known static-logic cross-coupled NAND/NOR structures where the false rail replaces the inverted single-rail signal. The completion logic output V can be implemented with dynamic completion detector logic that evaluates when eval is 1 and precharges when _pc is a 0 or with static logic equivalents.

The Delay Line and Delay Last elements together form a delay line for the single-rail logic and should together with the associated control path delays be long enough to satisfy the setup-time at the latches. These can be made with a string of inverters or pre-charged buffers. The advantage of the latter is that it minimizes the reset delay of the inverter. These inverters/buffers can be sized (or added to) using post-layout timing-driven buffer insertion techniques.

Figure 11:
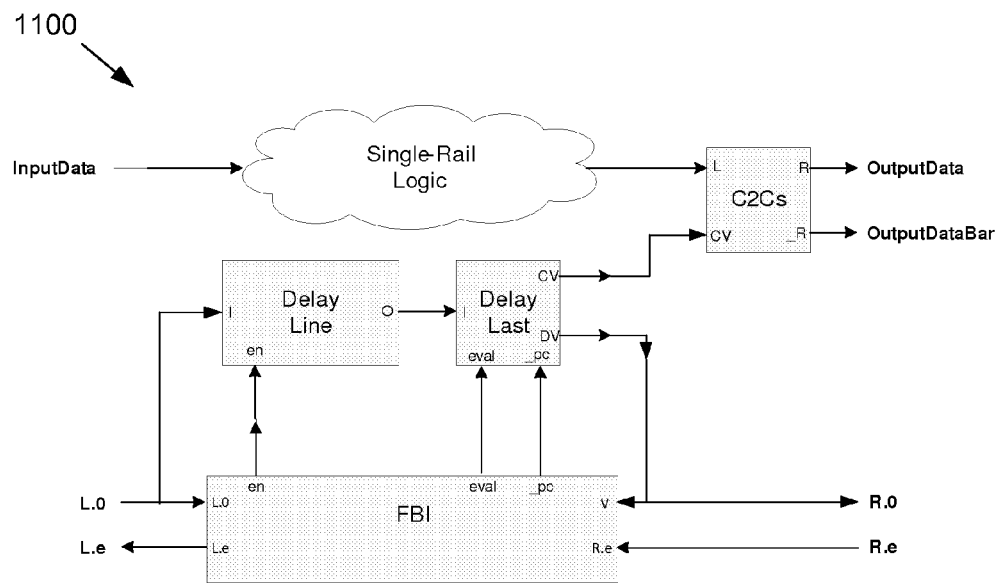
FIG. 11 depicts a diagram of a Bundled Data.

For certain embodiments, stages may only include single-rail logic with single-rail outputs. One such single-rail logic stage 1100 is depicted in FIG. 11. Notice if this stage feeds a pipeline stage with dual-rail logic an additional C2Ds can be added to generate the appropriate dual-rail signals.

Figure 12:
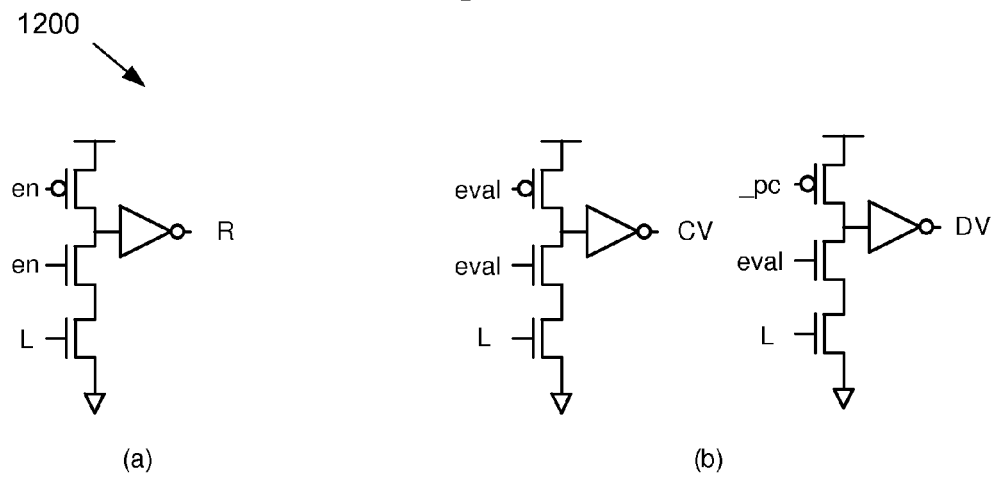
FIG. 12 includes views 12($a$) and 12($b$), which depict diagrams of Dynamic-gate implementations of a Delay Unit cell and a Delay Last cell, respectively, in accordance with exemplary embodiments of the present disclosure.

FIG. 12 depicts a diagram of an embodiment 1200 of an implementation of a Delay Line made up of a string of pre-charged Delay Unit cells depicted using dynamic logic as illustrated in FIG. 12(a). Delay Last can be implemented using dynamic logic as illustrated in FIG. 12(b). Static logic implementations based on sum-of-product implementations with feedback are also possible.

FIG. 13 depicts a method 1300 of designing asynchronous circuit templates, in accordance with exemplary embodiments of the present disclosure. With a suitable computer system (e.g., one with suitable processing, memory, and I/O functionality), an asynchronous circuit template can be generated that includes a plurality of asynchronous pipeline stages as described herein, as described at 1302. Each stage can include a data path with one or more domino logic cells and a control path including a controller, as described at 1304. The circuit template can be designed to operate with a full-buffer 4-phase handshaking protocol, as described at 1306.

The one or more domino logic cells can be designed to include a V_LOGIC cell that is configured to indicate a valid net signal when dual-rail output has been driven to a valid, non-neutral state, as described at 1308. Further, the one or more domino logic cells can be designed to include a COMPLETE cell configured to aggregate valid signals and generate an aggregate valid signal, as described at 1310. One skilled in the art will understand that other steps, sub-steps, and combinations as described herein can be added to or substituted for the elements of method 1300.

One skilled in the art will appreciate that embodiments and/or portions of embodiments of the present disclosure can be implemented in/with computer-readable storage media (e.g., hardware, software, firmware, or any combinations of such), and can be distributed and/or practiced over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs) implementing suitable code/instructions in any suitable language (machine dependent or machine independent). Further, embodiments of the present disclosure can be implemented in signals, e.g., wireless RF or optical transmissions and/or downloads from the Internet or other network. Templates can be designed with suitable computer systems (e.g., stand alone or having functionality distributed over a network) including processing and I/O functionality. I/O functionality of such systems can include any suitable type, including, but not limited to, mouse, keyboard, touch screen, track ball, file transfer, and the like. Such templates can be used as or for an input (e.g., as a netlist) to commercial software integrated circuit design tools/suites that are suitable for designing integrated circuits (optionally including designing mask shapes for the related lithography processes).

While certain embodiments have been described herein, it will be understood by one skilled in the art that the techniques (methods, systems, and/or algorithms) of the present disclosure may be embodied in other specific forms without departing from the spirit thereof. Accordingly, the embodiments described herein, and as claimed in the attached claims, are to be considered in all respects as illustrative of the present disclosure and not restrictive.

What is claimed is:

1. A computer-implemented method for designing an asynchronous circuit, the method comprising: using a computer system to generate a design for the asynchronous circuit that operates with a full-buffer, 4-phase handshaking protocol based on an asynchronous circuit template that includes a plurality of asynchronous pipeline stages, wherein each stage comprises (i) a data path including one or more dual-rail logic cells, each cell configured and arranged to receive and convey a token and having a true rail and a false rail, and (ii) a control path including a controller configured and arranged to control the one or more dual-rail logic cells and to communicate with other controllers via a handshaking protocol, wherein each pipeline stage contains dual-rail logic and the pipeline control supports a full-buffer 4-phase protocol with N levels of dual-rail logic, wherein N>1, and wherein the initial N−1 levels of dual-rail logic are configured to evaluate earlier than the last level of dual-rail logic and further comprising designing the circuit template to use a pre-charged completion unit to detect the validity of the dual-rail logic.

2. The method of claim 1, wherein the one or more dual-rail logic cells comprise a domino logic cell.

3. The method of claim 1, wherein the one or more dual-rail logic cells comprise a V_LOGIC cell configured and arranged to indicate a valid net signal when dual-rail output has been driven to a valid, non-neutral state.

4. The method of claim 1, wherein a COMPLETE cell is configured and arranged to aggregate one or more V_LOGIC valid signals and generate an aggregate valid signal.

5. The method of claim 1, wherein the controller comprises a full-buffer isolate (FBI) controller.

6. The method of claim 1, wherein the handshaking protocol implements a handshaking expansion (HSE) comprising:
    (a) defining a reset behavior of a FBI block;
    (b) defining a behavior of the FBI control block to environmental signals;
    (c) defining a 4-phase handshake on a Left Channel;
    (d) defines a 4-phase handshake on a Right Channel; and
    (e) defines behavior of the V input.

7. The method of claim 6, wherein for (b), R.0 does not appear and V is considered equivalent to R.0.

8. The method of claim 6, wherein for (e) the transitions of the V signal depend on both the _pc and eval signals.

9. The method of claim 1, further comprising designing the circuit template to use domino logic to implement the dual-rail logic.

10. The method of claim 1, wherein control components of the asynchronous circuit template are implemented with dynamic and pseudo-static logic elements.

11. The method of claim 10, wherein the logic elements comprise C-elements.

12. The method of claim 1, wherein the control components are implemented with static logic based on their sum-of-product representation with feedback.

13. The method of claim 1, wherein the circuit template supports a full-buffer 4-phase-protocol and single-rail logic matched with an asymmetric delay line decomposed into an initial and last stage, wherein the last stage is configured and arranged to close the pipeline latches without waiting for its handshaking environment to respond.

14. The method of claim 13, wherein the control components are implemented with static logic based on their sum-of-product representation with feedback.

15. The method of claim 1, wherein the circuit template supports asynchronous pipelines in which each pipeline stage contains dual-rail and single-rail logic and the pipeline control supports a full-buffer 4-phase protocol with N levels of dual-rail logic, wherein N>=1, and wherein the initial N−1 levels of dual-rail logic are allowed to evaluate earlier than the last level of dual-rail logic and also uses a delay line to match against the single-rail logic.

16. The method of claim 15, further comprising designing the template to use domino logic to implement the dual-rail logic.

17. The method of claim 15, wherein the template comprises an asymmetric delay line.

18. The method of claim 1, further comprising constructing an integrated circuit based on the asynchronous circuit template.

19. The method of claim 1, further comprising producing, with the computer system, an output of an asynchronous netlist corresponding to the asynchronous circuit template.

20. A computer-executable program product for designing asynchronous circuits, the program product comprising a tangible, non-transitory computer-readable storage medium with resident computer-readable instructions, which when loaded in a computer system causes the computer system to:
    generate a design for an asynchronous circuit that operates with a full-buffer, 4-phase handshaking protocol, based on an asynchronous circuit template that includes a plurality of asynchronous pipeline stages, wherein each stage comprises (i) a data path including one or more domino logic cells, each cell configured and arranged to receive and convey tokens and having a true rail and a false rail, and (ii) a control path including a controller configured and arranged to control the one or more domino logic cells and to communicate with other controllers via a handshaking protocol, wherein each pipeline stage contains dual-rail logic and the pipeline control supports a full-buffer 4-phase protocol with N levels of dual-rail logic, wherein N>1, wherein the initial N−1 levels of dual-rail logic are configured to evaluate earlier than the last level of dual-rail logic and wherein the circuit template uses a pre-charged completion unit to detect the validity of the dual-rail logic.

21. The computer-executable program product of claim 20, wherein the one or more dual-rail logic cells comprise a domino logic cell.

22. The computer-executable program product of claim 20, wherein the one or more domino logic cells comprise a V_LOGIC cell configured and arranged to indicate a valid net signal when dual-rail output has been driven to a valid, non-neutral state.

23. The computer-executable program product of claim 20, wherein the one or more domino logic cells comprise a COMPLETE cell configured and arranged to aggregate valid signals and generate an aggregate valid signal.

24. The computer-executable program product of claim 20, wherein the controller comprises a full-buffer isolate (FBI) controller.

25. The computer-executable program product of claim 20, wherein the circuit template uses domino logic to implement the dual-rail logic.

26. The computer-executable program product of claim 20, wherein control components of the asynchronous circuit template are implemented with dynamic and pseudo-static logic elements.

27. The computer-executable program product of claim 26, wherein the logic elements comprise C-elements.

28. The computer-executable program product of claim 20, wherein the control components are implemented with static logic based on their sum-of-product representation with feedback.

29. The computer-executable program product of claim 20, wherein the circuit template supports a full-buffer 4-phase-protocol and single-rail logic matched with an asymmetric delay line decomposed into an initial and last stage, wherein the last stage is configured and arranged to close the pipeline latches without waiting for its handshaking environment to respond.

30. The computer-executable program product of claim 29, wherein the control components are implemented with static logic based on their sum-of-product representation with feedback.

31. The computer-executable program product of claim 20, wherein the circuit template supports asynchronous pipelines in which each pipeline stage contains dual-rail and single-rail logic and the pipeline control supports a full-buffer 4-phase protocol with N levels of dual-rail logic, wherein N>=1, and wherein the initial N−1 levels of dual-rail logic are allowed to evaluate earlier than the last level of dual-rail logic and also uses a delay line to match against the single-rail logic.

32. A system for designing an asynchronous circuit, the system comprising:
   a processing system configured and arranged to generate a design for the asynchronous circuit that operates with a full-buffer, 4-phase handshaking protocol based on an asynchronous circuit template that includes a plurality of asynchronous pipeline stages, wherein each stage comprises (i) a data path including one or more domino logic cells, each cell configured and arranged to receive and convey tokens and having a true rail and a false rail, and (ii) a control path including a controller configured and arranged to control the one or more domino logic cells and to communicate with other controllers via a handshaking protocol, wherein each pipeline stage contains dual-rail logic and the pipeline control supports a full-buffer 4-phase protocol with N levels of dual-rail logic, wherein N>1N, wherein the initial N−1 levels of dual-rail logic are configured to evaluate earlier than the last level of dual-rail logic and wherein the circuit template uses a pre-charged completion unit to detect the validity of the dual-rail logic;
   and
   a display system configured and arranged to display the design of the asynchronous circuit.

33. The system of claim 32, further comprising an I/O system configured and arranged to output the asynchronous circuit template as a netlist.

34. A multi-level domino circuit that operates with a full-buffer, 4-phase handshaking protocol comprising: an asynchronous circuit that includes a plurality of asynchronous pipeline stages, wherein each stage comprises (i) a data path including one or more dual-rail logic cells, each cell configured and arranged to receive and convey a token and having a true rail and a false rail, and (ii) a control path including a controller configured and arranged to control the one or more dual-rail logic cells and to communicate with other controllers via a handshaking protocol, wherein each pipeline stage contains dual-rail logic and the pipeline control supports a full-buffer 4-phase protocol with N levels of dual-rail logic, wherein N>1, wherein the initial N−1 levels of dual-rail logic are configured to evaluate earlier than the last level of dual-rail logic and wherein the circuit template uses a pre-charged completion unit to detect the validity of the dual-rail logic.

35. The circuit of claim 34, wherein the controller is configured to (i) provide an enable (EN) signal to the domino logic of the data path, and (ii) provide a precharge (_PC) and evaluation signal (EVAL) to the cell for driving bits of the data path.

36. The circuit of claim 34, wherein the cell for driving bits of the data path comprises a V_LOGIC cell.

* * * * *